United States Patent [19]
Thompson, Sr.

[11] Patent Number: 5,704,535
[45] Date of Patent: Jan. 6, 1998

[54] SHIELD AND METHOD FOR SELECTIVE WAVE SOLDERING

[75] Inventor: Curtis C. Thompson, Sr., Meridian, Id.

[73] Assignee: Micron Electronics, Inc., Nampa, Id.

[21] Appl. No.: 801,996

[22] Filed: Feb. 18, 1997

Related U.S. Application Data

[63] Continuation of Ser. No. 498,670, Jul. 3, 1995, Pat. No. 5,617,990.
[51] Int. Cl.$^6$ .................. B23K 3/00; H05K 3/34
[52] U.S. Cl. ................. 228/39; 228/215; 118/504
[58] Field of Search .................. 228/37, 39, 57, 228/180.1, 215; 118/301, 406

[56] References Cited

U.S. PATENT DOCUMENTS

| | | | |
|---|---|---|---|
| 4,720,034 | 1/1988 | Lee | 228/37 |
| 4,739,919 | 4/1988 | Van Den Brekel et al. | 228/38 |
| 5,148,961 | 9/1992 | Humbert et al. | 228/37 |

OTHER PUBLICATIONS

Product data sheets—2 pgs. Composite Delmat Material, Von Roll Isola, Inc.
Product data sheets—2 pgs. CDM-ESD 68.610, Von Roll Isola, Inc.

*Primary Examiner*—Samuel M. Heinrich
*Attorney, Agent, or Firm*—Craig M. Korfanta

[57] ABSTRACT

A shield (50) for use in wave soldering processes to selectively affix solder to an area of circuit board (20), having one or more electronic components (21) on the solder side of the board, is disclosed. Shield (50) includes a generally planar base member (51) of low thermal conductivity which forms the foundation of shield (50). Marginally disposed registration ridges (54) are formed on the upper surface (52). Registration ridges (54) serve to hold circuit board (20) against shield (50) in a fixed position. Ridges (54) are positioned to closely receive the peripheral edges of circuit board (20). One or more solder flow openings (56) are formed through base member (51) extending from upper side (52) to lower side (53). Solder flow openings (56) are positioned to align with the selected areas of circuit board (20) to which solder is to be affixed. One or more recesses (55) are provided in the upper surface (52) of base member (51) to receive and shield electronic components (21).

14 Claims, 9 Drawing Sheets

SHIELD AND METHOD FOR SELECTIVE WAVE SOLDERING

This application is a continuation of application Ser. No. 08/498,670, filed Jul. 3, 1995, now U.S. Pat. No. 5,617,990.

BACKGROUND OF THE INVENTION

1. Technical Field

This invention generally relates to methods and devices for applying solder to workpieces. More particularly, this invention relates to a method and an apparatus which uses a shield to allow selective application of solder to a circuit board with a wave soldering device.

2. Background

Most electronic devices use a circuit board as the fundamental building block for the electronic circuitry which forms the device. With the advent of the printed circuit board (PCB), the board itself actually became part of the circuit, forming conductors for the electrical current between the various electronic components. The circuit board both supports the electronic components and links them together. Generally, it consists of a nonconductive base, such as fiberglass, coated with a thin layer of a conductor, such as copper, which is etched to form a pattern of electrical conductors. Further advances in PCB technology resulting in dual sided PCBs, to which components are attached on both sides of the boards, and in multilayered PCBs, which allow intricate and complex circuits to be implemented in a smaller footprint. The various layers of multilayered PCB are electrically connected together at desired points by vias, which are vertical conductive shafts formed in the base of the board.

Soldering of the various electronic components to a circuit board is generally accomplished by one or more of the following processes: manual soldering; reflow soldering; batch soldering using a solder pot; or continuous soldering using a wave soldering device. Manual soldering involves employing a manufacturing technician using a soldering iron to solder each joint individually. This is an expensive and relatively slow manufacturing technique. However, it is sometimes necessary, especially when a particular component can't be soldered using one of the other soldering techniques, as might be the case where a component is heat sensitive and cannot be subjected to the high temperatures of reflow, pot and wave soldering.

Reflow soldering involves applying a paste of flux and solidified solder balls to the electrical connecting points on the component and the connection pads on the circuit board and heating the entire assembly in an oven to make the solder reflow to form an electrically conductive connection. This process requires that all of the components be able to withstand the relatively high temperatures necessary to form a reliable solder joint. Additionally, while well suited to mounting surface mount components, this process is not suited for attachment of through hole components.

Solder pot soldering involves batch processing, usually a single board at a time. A solder pot is a device which has a reservoir of molten solder, a plenum extending from the reservoir, one or more flow wells attached to the plenum and a pump for pumping the solder up through the plenum and out the flow wells. While this device is well suited for selective soldering, it can only solder a single batch, usually one board, at a time.

Wave soldering is the soldering method of choice for circuit boards which require through hole parts. This is a continuous process in which circuit boards are passed over a wave of molten solder. The solder wicks up through the vias and the through holes containing the component leads to consummate the soldering process. While this process lends itself to automation as the parts are simply loaded onto a conveyor which in turn passes the parts over a wide wave of solder, it also imposes restrictions in terms of which parts can be exposed to the high thermal shock of a molten solder wave. For instance, it is often times desirable to mix surface mount components and through hole components on the same board. However, it usually isn't desirable to expose a surface mount component directly to a solder wave as thermal damage to the component may result. Additionally, the connections of surface mount components are so close together that solder can easily bridge two or more connections. Consequently, boards containing components or areas on the side of the board which cannot be exposed to a wave, which otherwise would be wave soldered, must be soldered by some other method.

U.S. Pat. No. 5,148,961 to HUMBERT ET AL. discloses a partial solution to solve this problem which is a hybrid soldering technique. The technique disclosed creates a narrow solder wave from a solder pot and selectively applies this wave to a circuit board through a pallet containing a solder mask for the narrow portion of the board which is exposed to the solder pot wave. The pallet mask includes through holes which correspond to the areas of the board on which solder is to be deposited and recesses in the mask to house and protect components which would otherwise be exposed to the solder. The pallet is also provided with an inverted "V" shaped channel on the pallet's underside to prevent solder from splashing onto other parts of the circuit board. Unfortunately, this solution still requires a separate soldering device apart from a wave soldering machine. Also, this solution is not suited or capable of simultaneously and selectively soldering two or more areas of a circuit board which are not located in the same narrow area of the board, since the entire board cannot be simultaneously passed through the wave.

What is needed is a way to selectively apply solder to a workpiece, such as a circuit board, using a standard or conventional wave soldering machine. Some of the advantages realized by satisfying this need include: simultaneously and selectively soldering areas of a workpiece which are spaced apart relatively large distances; employing existing wave soldering machinery already in the possession of the manufacturer to wave solder pieces which previously could only be soldered by other less efficient or desirable methods and realizing the aforementioned advantages with only a small investment in additional tooling.

Objects of this invention therefore include the provision of a reusable shield for protecting selected areas of a workpiece from molten solder and heat as the shield and workpiece are passed through a solder wave. An additional object of this invention is to provide a low cost solution to some the aforementioned disadvantages of the prior art. Still another object of the invention is to provide a solution which can be used with existing wave soldering devices to selectively apply solder to a workpiece and thereby realize all of the advantages of wave soldering for pieces which previously could not be wave soldered.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to the present invention, these and other objects are achieved by a shield which includes a base member made from a material having low thermal conductivity and which is resistant to solder. A registration means is provided which is attached to the base member for holding the circuit board to be soldered against the base member in a fixed position relative to the base member. In the preferred embodiment, the registration means employs marginally disposed ridges formed on the upper surface of the base member and from the same material as the base member. The ridges are positioned to closely receive the edges of the circuit board. The base member includes one or more solder flow openings therethrough, each being positioned to align with an area of the circuit board to which solder is to be affixed. The base member can also include one or more recesses in the upper surface which are positioned to receive any electronic components and thereby shield the components from solder.

To use the invention the circuit board to be soldered is first registered against the shield with the solder flow openings aligned with the corresponding areas on the circuit board to which solder is to be affixed. The circuit board and shield are then oriented relative to the solder wave with the shield between the circuit board and the wave. The circuit board and shield are then passed through the crest of the wave of solder to subject the exposed areas of the underside of the circuit board to solder.

DETAILED DESCRIPTION OF THE INVENTION

Figure 1:
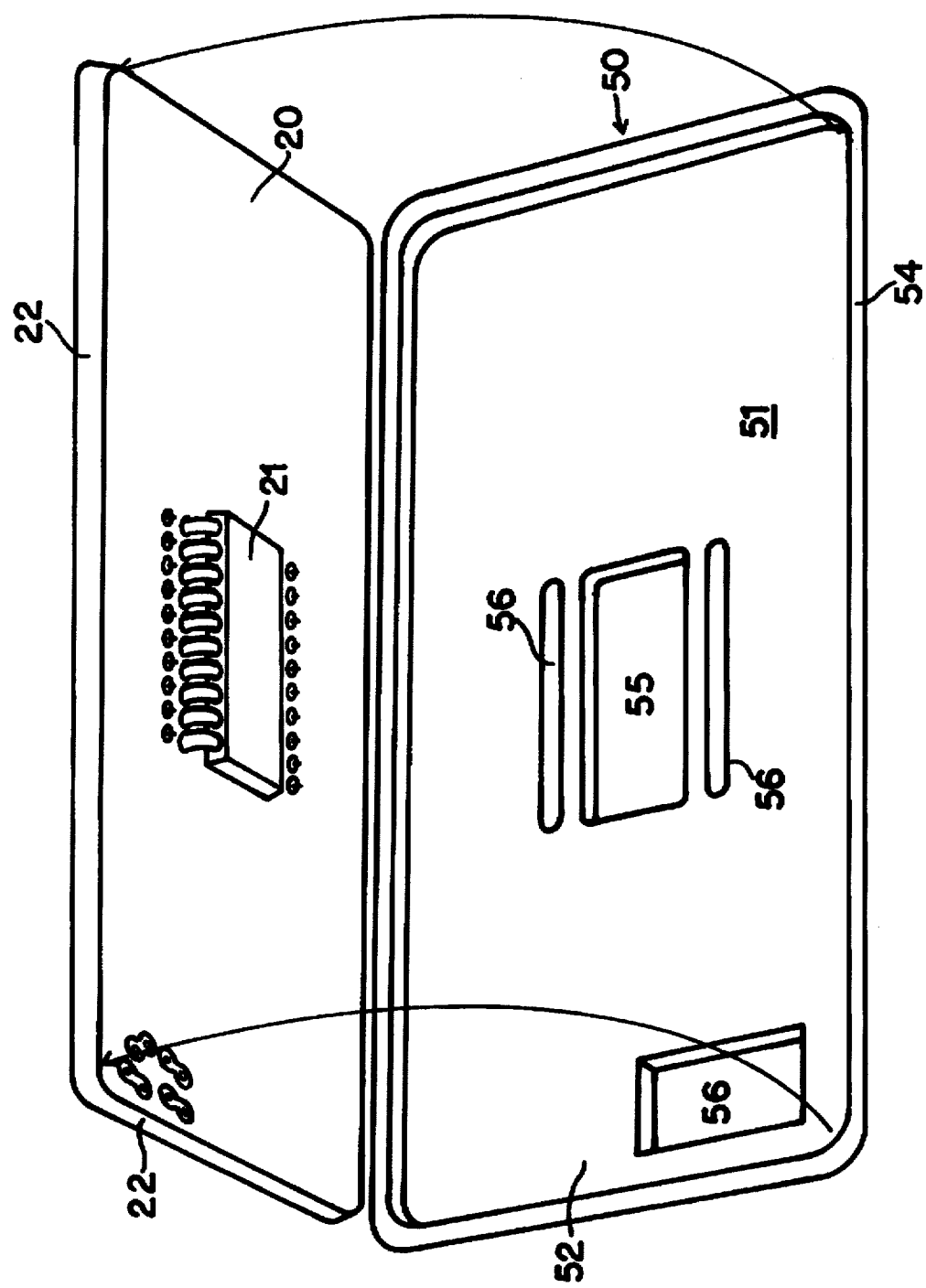
FIG. 1 is an exploded assembly perspective view of a shield according to the invention and a circuit board to be wave soldered.
Figure 2:
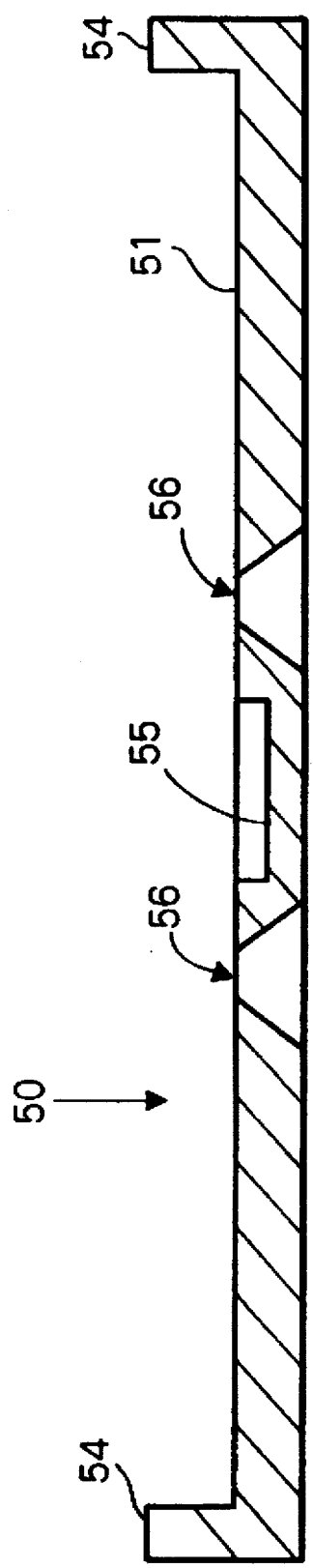
FIG. 2 is a cross section view of the shield taken along section line 2—2 of FIG. 1.

Referring now to the figures a shield 50 for use in wave soldering processes to selectively affix solder to an area of circuit board 20, having one or more electronic components 21 on the solder side of the board, is shown. Shield 50 has a generally planar base member or plate 51 which forms the foundation of shield 50. Here, base plate 51 is made from a heat and solder resistant material sold under the tradename DELMAT and manufactured by Von Roll Isola, Inc. in Rutland, Vt. This material is a composite material which machinable, maintains its mechanical properties at soldering temperatures, is resistant to solder and has low thermal conductivity of approximately $3 \times 10^{-6}$ W/cm.K, making it a good thermal shield. An electrostatic dissipative version of this material is sold under the tradename CDM-ESD 68.610 which is manufactured by the same company and is suitable for electrostatic discharge sensitive applications. While base member 51 is here shown being substantially flat or planar, it should be noted that other configurations are contemplated for shielding workpieces other than relatively flat circuit boards.

Marginally disposed registration ridges 54 are attached or otherwise formed on the upper surface 52, also referred to as the first side. Registration ridges 54 together define a registration means attached to base member 51 for holding the circuit board 20 against shield 50 in a fixed position. Ridges 54 are positioned to closely receive the peripheral edges of circuit board 20 and can even frictionally engage circuit board 20 to prevent the board from floating on top of the solder wave. Optionally, clamps or similar devices can be used to secure circuit board 20 to shield 50. Additionally, other registration means can be employed such as various shaped pins and corresponding holes in either the circuit board or the shield.

One or more solder flow openings 56 are formed through base member 51 extending from upper side 52 to lower side 53. Solder flow openings 56 are positioned to align with the selected areas of circuit board 20 to which solder is to be affixed. Solder flow openings 56 are defined by edges 57 which diverge away from the upper side 52 to form a larger opening in the lower side 53 of base member 51. Preferably, edges 57 are beveled at an angle of 45° or greater with respect to a line perpendicular to the upper and lower surfaces of base member 51.

FIGS. 5, 6, 7 and 8 depict a few of the possible configurations for edges 57. The configuration shown in FIG. 5 corresponds to edges 57 which are substantially perpendicular to the upper and lower surfaces of base member 51. This configuration is not optimum as it is believed that the sharp edges provide more turbulence than desired to provide consistent wetting and the meniscus has a smaller radius of curvature than desired to provide adequate wetting near the contact point between the edge and the circuit board. It should be apparent that these limitations are dependent upon the relative geometries and spacing available. If adequate spacing is available, or the shielded areas of the board are located relatively large distances from the areas to be soldered, perpendicular edges may be acceptable and even desirable since they are generally less expensive and time consuming to form.

Figure 6:
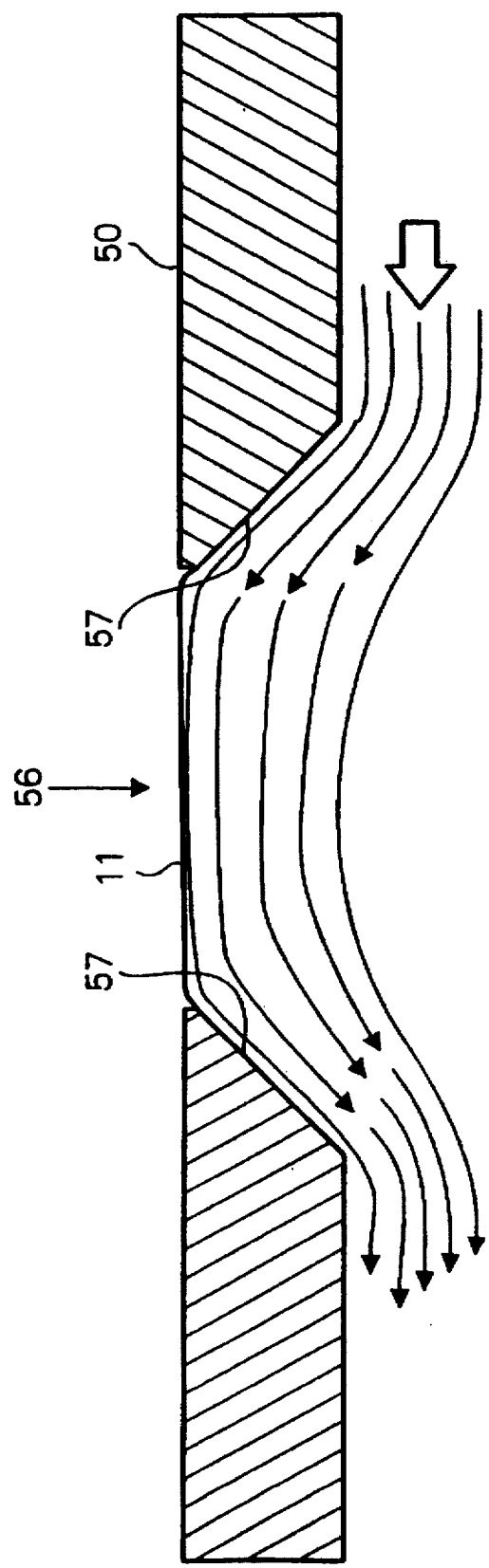
FIG. 6 is a cross section view of a portion of a shield according to the invention, showing a second possible configuration for the edges surrounding a solder flow opening.
Figure 7:
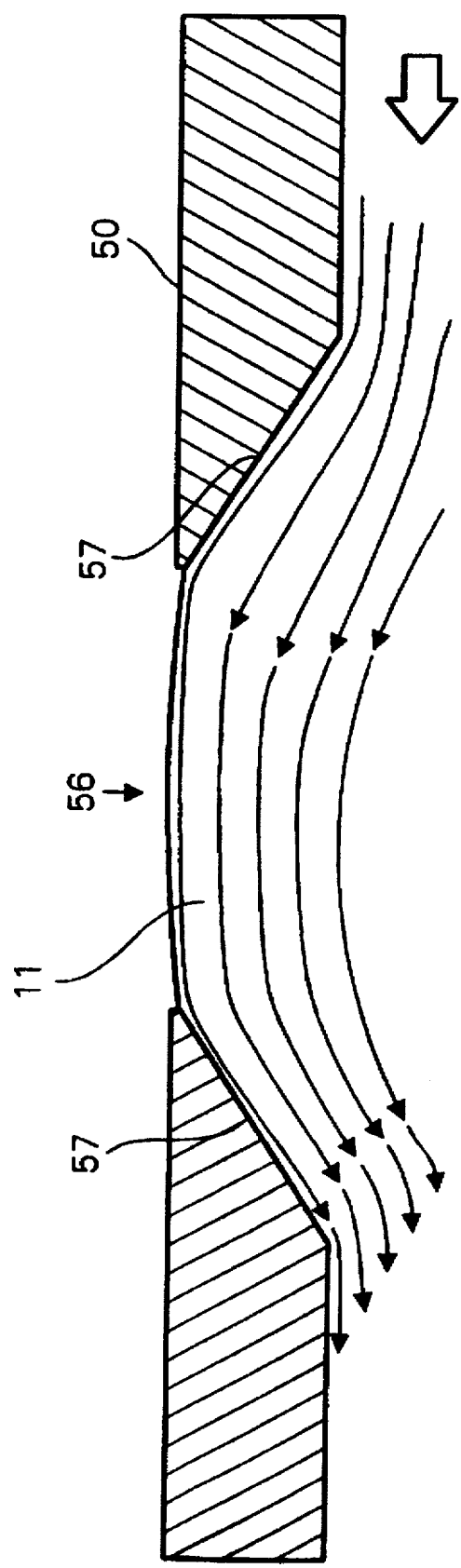
FIG. 7 is a cross section view of a portion of a shield according to the invention, showing a third possible configuration for the edges surrounding a solder flow opening.
Figure 8:
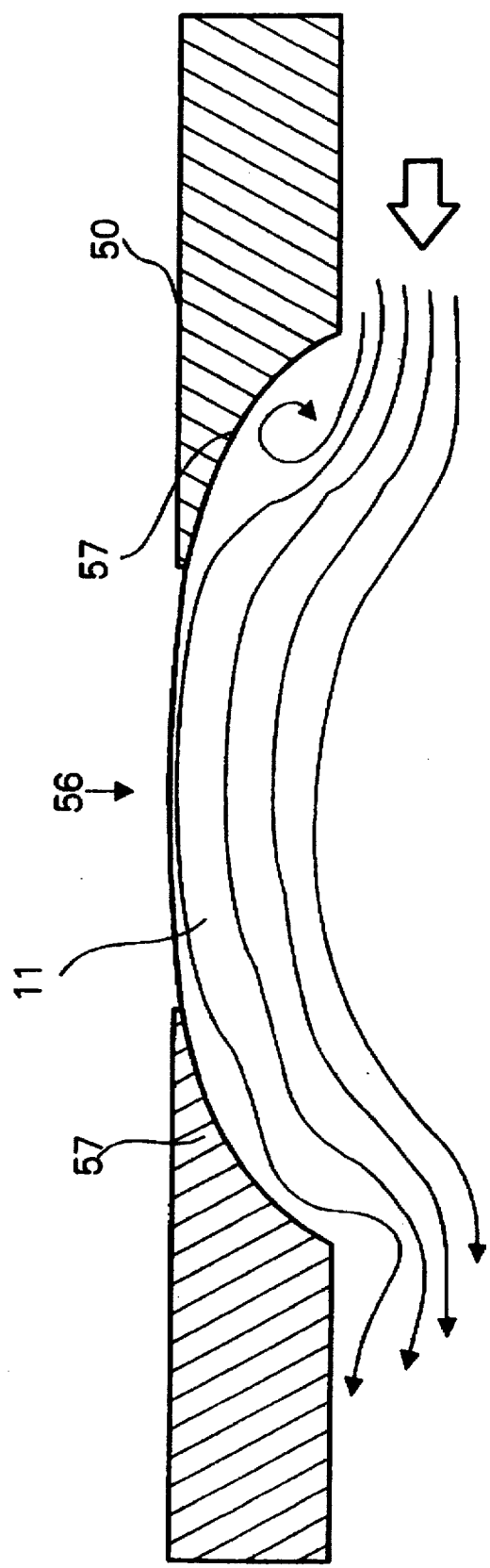
FIG. 8 is a cross section view of a portion of a shield according to the invention, showing a fourth possible configuration for the edges surrounding a solder flow opening.
Figure 9:
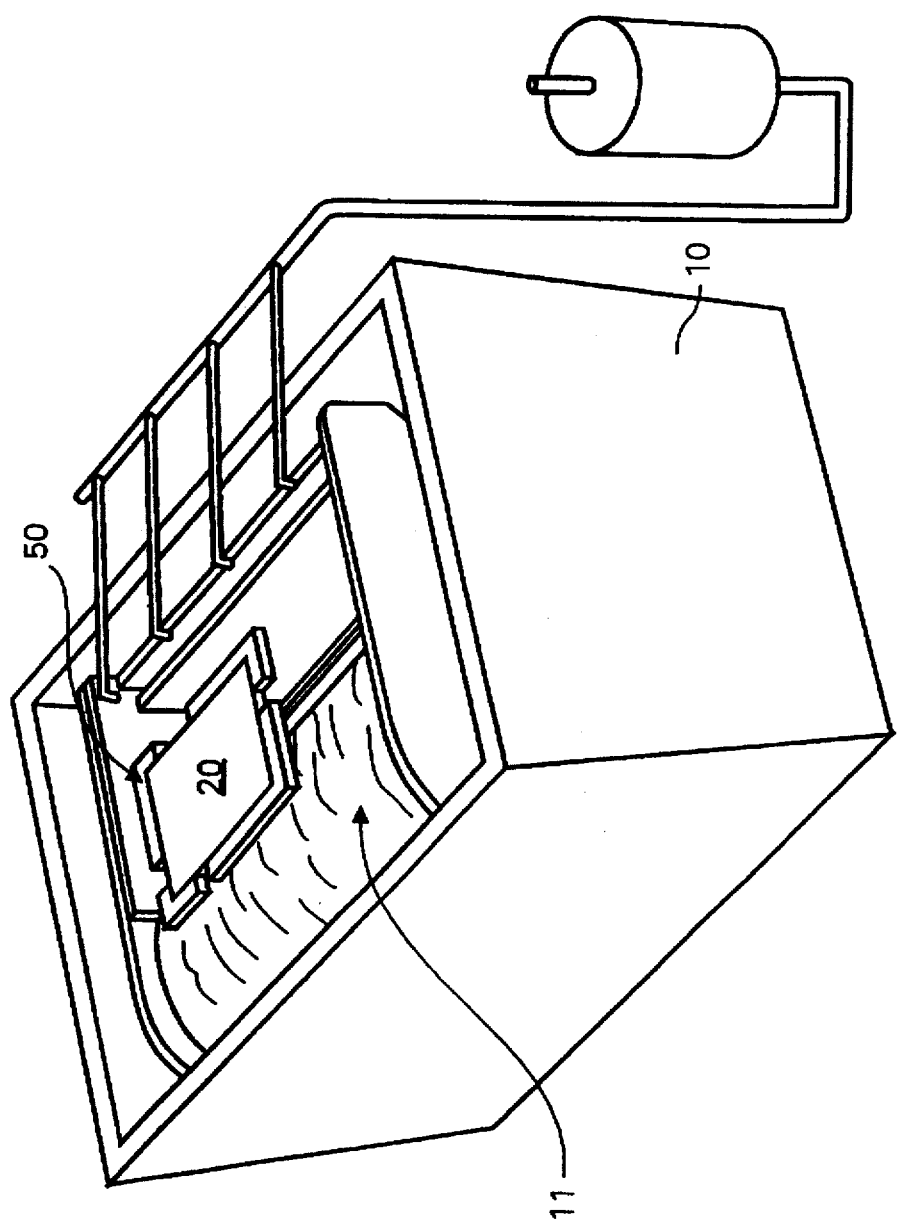
FIG. 9 is a representational view of a circuit board being soldered with a wave soldering device employing a shield according to the invention.

FIG. 6 shows edges 57 which are beveled at a 45° angle. As can be seen in the figure, it is believed that this configuration provides both for laminar flow of the solder and a relatively flat portion at the top of the meniscus. this configuration seems to provide the optimum compromise between available space and desired wetting. FIG. 7 shows edges 57 which are beveled at an angle greater than 45°, improving the laminar flow conditions and flattening the meniscus even further. In the configurations shown in FIGS. 6, 7 and 8, a small vertical section, preferably less than 1/32of an inch in height, is formed along the top of each edge 57 at the intersection of edge 57 and upper surface 52. This feature provides durability to a potentially fragile geometry and a more definite edge to solder flow openings 56.

Figure 3:
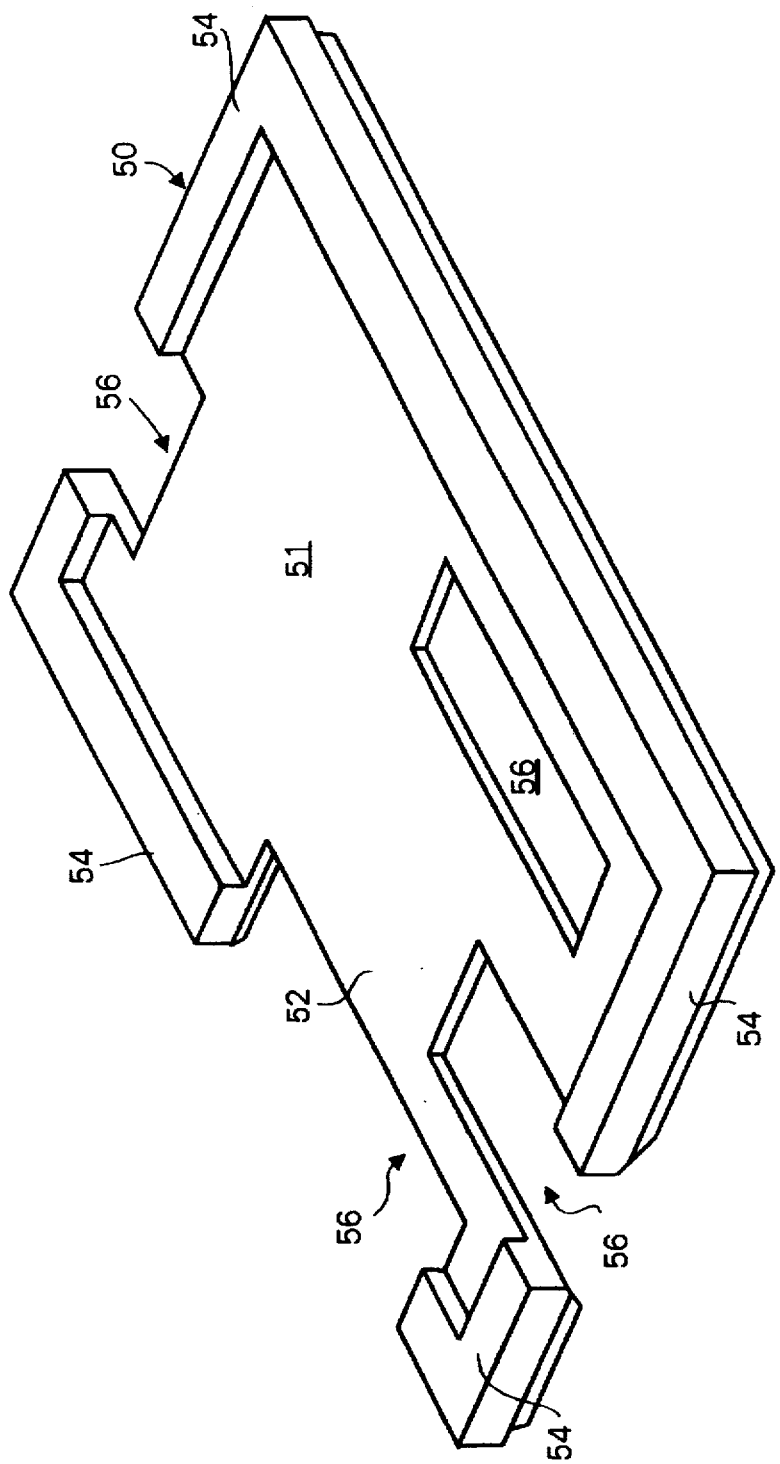
FIG. 3 is an isometric view of the upper surface of a differently configured shield according to the invention.

Solder flow openings 56, depending upon their shapes, are each defined by at least one edge 57. Circular or elliptical holes have a single edge while rectilinear holes are normally defined by three or more edges. In the case of desirable bet sides, the minimum desirable between the edge of the opening and the edge of the area to be solder should be 0.15 inches. The phrase "solder flow opening" is used herein to describe the solder flow paths through base member 51 and includes both rectangular and triangular flow paths with open sides as well as traditional closed peripheral openings. FIG. 3 shows three rectangular solder flow openings 56 which have one open side. From here, one can easily visualize a rectangular opening located at the intersection of two sides of the shield where the opening has two contiguous open sides to form a rectangular cut out at the corner of the shield. Similarly, one can visualize a triangular cut out which is simply defined by a diagonal edge joining two perpendicular edges of the shield. In these cases, the minimum distance from the opening edge and the edge of the area to be soldered can be decreased to about 0.1 inches.

One or more recesses 55 are provided in the upper surface 52 of base member 51 to receive and shield electronic components 21 which are positioned on the side of circuit board 20 which is to be subjected to the solder wave. The thickness of base member 51 and the depth of any recess 55 can be altered to adjust both for component height and for desired thermal shielding characteristics.

Figure 4:
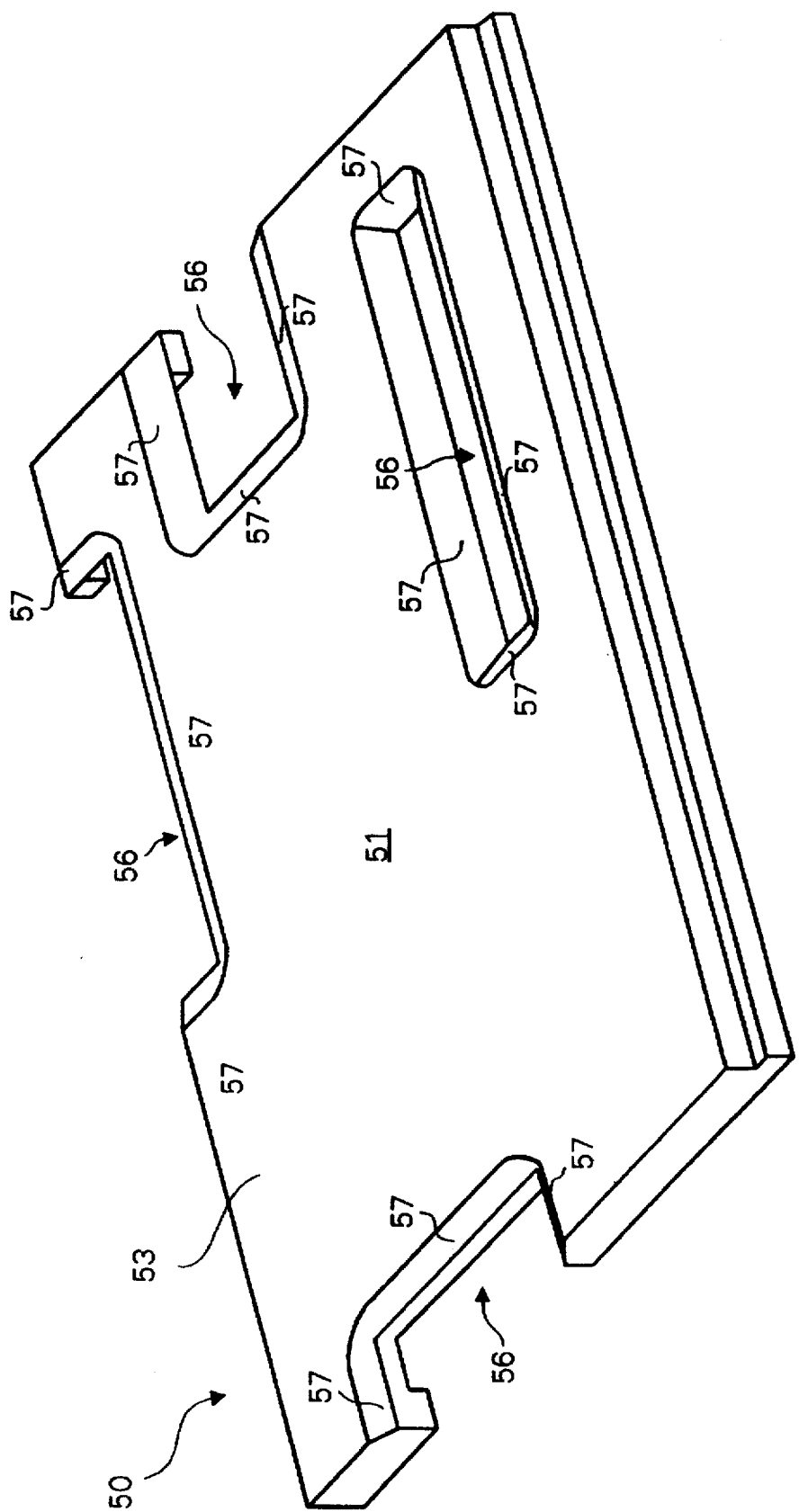
FIG. 4 is an isometric view of the lower surface of the shield shown in FIG. 3.
Figure 5:
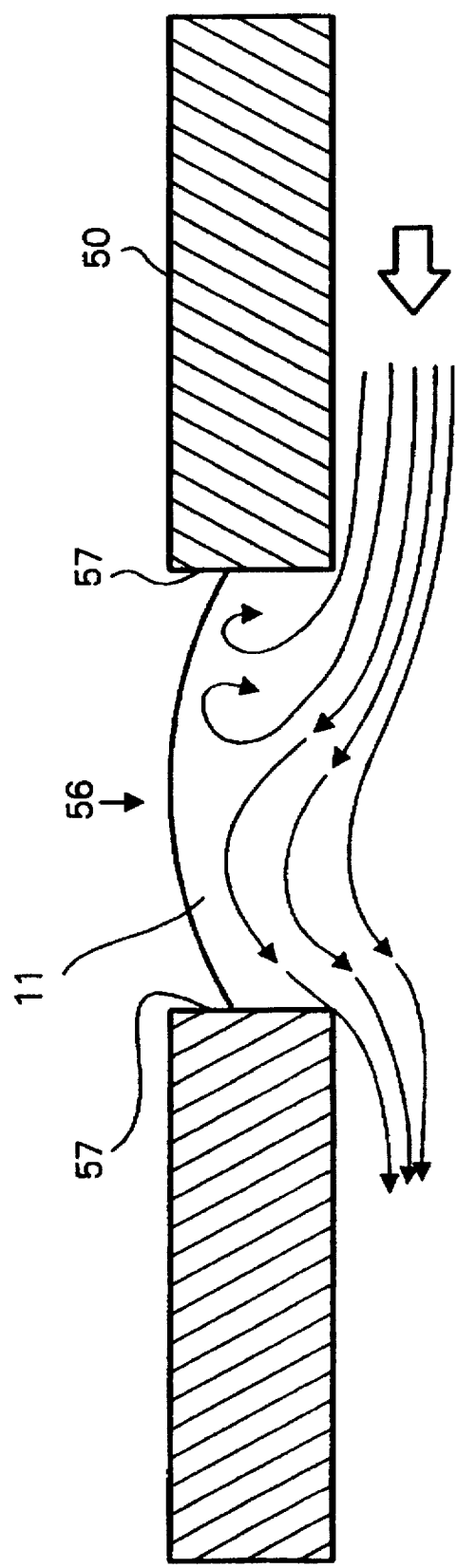
FIG. 5 is a cross section view of a portion of a shield according to the invention, showing one possible configuration for the edges surrounding a solder flow opening.

The invention is implemented in the following manner. First, a shield 50 is manufactured with solder flow openings 56 located at the necessary locations. Any recesses 55 necessary to shield component 21 are also formed in shield 50. The circuit board 20 is then registered against a shield 50 with solder flow openings 56 aligned with their corresponding areas on the circuit board to which solder is to be affixed and any recesses receiving the electronic components to be shielded. Shield 50 and circuit board 20 are then oriented relative to solder wave 11 with shield 50 between circuit board 20 and solder wave 11. Shield 50 and circuit board 20 are then passed through the crest of solder wave 11 subjecting the underside surface of shield 50 and the exposed areas of circuit board 20 to molten solder. Most conventional wave solder machines 10 include a conveyor mechanism to facilitate this last step. In that case, shields 50 are loaded onto pallets carried by the conveyor mechanism. FIGS. 3 and 4 depict a shield 50 which includes rabbit grooves along opposing underside edges thereof for receiving, and registering shield 50 in, a pallet. Like the registration means between the shield and the circuit board, a clamp mechanism can be provided to fix shields 50 into the pallets to prohibit vertical displacement of the shields as they are passed through the solder wave.

While there is shown and described the preferred embodiment of the invention, it is to be distinctly understood that this invention is not limited thereto but may be variously embodied to practice within the scope of the following claims.

I claim:

1. A shield for use in wave soldering processes to selectively affix solder to an area of a circuit board which comprises:

a base member including at least a portion thereof having low thermal conductivity;

a circuit board registration mechanism attached to the base member, the registration mechanism including a circuit board edge engagement mechanism; and the base member having an opening therethrough positioned to align with the area of the circuit board to which solder is to be affixed.

2. The shield of claim 1 wherein:

the base member is substantially flat and includes a first side and a second side and a recess where the recess is positioned in the first side to receive an electronic component affixed to the circuit board and thereby shield the component from solder;

the opening extends from the first side to the second side; and the registration mechanism is configured to hold the circuit board against the first side.

3. The shield of claim 2 wherein the opening is defined by at least one edge which diverges away from the circuit board when it is registered against the base member.

4. The shield of claim 3 wherein the opening is defined by at least one edge and the edge is positioned a minimum distance of 0.1 inches from the area to be soldered when the circuit board is registered against the base member.

5. The shield of claim 4 wherein the opening is defined by at least three edges and all of the edges are positioned a minimum distance of 0.15 inches from the area to be soldered when the circuit board is registered against the base member.

6. The shield of claim 3 wherein the opening is defined by at least three edges and all of the edges are positioned a minimum distance of 0.15 inches from the area to be soldered when the circuit board is registered against the base member.

7. The shield of claim 2 wherein the opening is defined by at least three edges and all of the edges are positioned a minimum distance of b 0.15inches from the area to be soldered when the circuit board is registered against the base member.

8. The shield of claim 1 wherein the opening is defined by at least three edges and all of the edges are positioned a minimum distance of 0.15 inches from the area to be soldered when the circuit board is registered against the base member.

9. The shield of claim 1 wherein the opening is defined by at least one edge which diverges away from the circuit board when it is registered against the base member.

10. In combination with a wave soldering apparatus for affixing solder to a circuit board, a shield for selectively affixing the solder which comprises:

a base member including at least a portion thereof having a low thermal conductivity;

a circuit board registration mechanism attached to the base member, the registration mechanism including a circuit board edge engagement mechanism; and the base member having an opening therethrough being positioned to align with the area of the circuit board to which solder is to be affixed.

11. The shield of claim 10 wherein:

the base member is substantially flat and includes a first side and a second side and a recess where the recess is positioned in the first side to receive an electronic component affixed to the circuit board and thereby shield the component from solder;

the opening extends from the first side to the second side; and the registration mechanism is configured to hold the circuit board against the first side.

12. The shield of claim 11 wherein the flow opening is defined by at least one edge which diverges away from the circuit board when it is registered against the base member.

13. The shield of claim 10 wherein the opening is defined by at least one edge and the edge is positioned a minimum distance of 0.1 inches from the area to be soldered when the circuit board is registered against the base member.

14. The shield of claim 13 wherein the opening is defined by at least three edges and all of the edges are positioned a minimum distance of 0.15 inches from the area to be soldered when the circuit board is registered against the base member.

* * * * *